US006546512B1

(12) United States Patent
Ochoa et al.

(10) Patent No.: US 6,546,512 B1
(45) Date of Patent: Apr. 8, 2003

(54) SEMICONDUCTOR INTEGRATED CIRCUIT HAVING COMPRESSION CIRCUITRY FOR COMPRESSING TEST DATA, AND THE TEST SYSTEM AND METHOD FOR UTILIZING THE SEMICONDUCTOR INTEGRATED CIRCUIT

(75) Inventors: Roland Ochoa, Boise, ID (US); Gregory L. Cowan, Boise, ID (US); Kim M. Pierce, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/940,010

(22) Filed: Aug. 27, 2001

Related U.S. Application Data

(63) Continuation of application No. 09/175,518, filed on Oct. 20, 1998, now Pat. No. 6,314,538, which is a continuation of application No. 08/881,946, filed on Jun. 25, 1997, now Pat. No. 5,864,565, which is a continuation of application No. 08/353,404, filed on Dec. 9, 1994, now abandoned, which is a continuation-in-part of application No. 08/077,182, filed on Jun. 15, 1993, now abandoned.

(51) Int. Cl.$^7$ .............................................. G01R 31/28
(52) U.S. Cl. ...................................... 714/724; 324/765
(58) Field of Search ........................ 714/724; 365/201; 324/765

(56) References Cited

U.S. PATENT DOCUMENTS

| 4,517,661 A | 5/1985 | Graf et al. ...................... 714/25 |
| 4,637,020 A | 1/1987 | Schinabeck .................. 714/736 |
| 4,656,632 A | 4/1987 | Jackson ....................... 714/736 |
| 4,760,330 A | 7/1988 | Lias, Jr. ........................ 714/32 |
| 4,794,597 A | 12/1988 | Ooba et al. .................. 714/703 |
| 4,799,004 A | 1/1989 | Mori .......................... 714/726 |
| 4,827,476 A | 5/1989 | Garcia ........................ 714/728 |
| 4,837,765 A | 6/1989 | Suzuki ........................ 714/724 |
| 4,860,259 A | 8/1989 | Tobita ........................ 365/201 |
| 4,864,579 A | 9/1989 | Kishida et al. ............. 714/726 |
| 4,879,717 A | 11/1989 | Sauerwald et al. .......... 714/727 |
| 4,916,700 A | 4/1990 | Ito et al. ...................... 714/718 |
| 4,926,426 A | 5/1990 | Scheuneman et al. ....... 714/772 |
| 4,965,799 A | 10/1990 | Green et al. ................. 714/719 |
| 4,996,691 A | 2/1991 | Wilcox et al. ............... 714/820 |
| 5,005,173 A | 4/1991 | Martin ........................ 714/734 |
| 5,051,997 A | 9/1991 | Sakashita et al. ............ 714/732 |
| 5,072,137 A | 12/1991 | Slemmer ..................... 326/16 |
| 5,130,646 A | 7/1992 | Kojima ........................ 324/737 |
| 5,293,386 A | 3/1994 | Muhmenthaler et al. .... 714/718 |
| 5,305,261 A | 4/1994 | Furutani et al. ......... 365/189.07 |
| 5,311,473 A | 5/1994 | McClure et al. ............ 365/201 |
| 5,422,892 A | 6/1995 | Hii et al. ..................... 714/735 |
| 5,444,717 A | * 8/1995 | Rotker et al. ............... 714/744 |
| 5,457,696 A | 10/1995 | Mori .......................... 714/720 |
| 5,475,692 A | 12/1995 | Hatano et al. .............. 714/719 |
| 5,825,783 A | 10/1998 | Momohara .................. 714/718 |

OTHER PUBLICATIONS

Schilling et al., "Electronic Circuits," pp. 615–618, pp. 633–634, p. 645, 1989.

\* cited by examiner

*Primary Examiner*—Albert Decady
*Assistant Examiner*—Shelly A Chase
(74) *Attorney, Agent, or Firm*—TraskBritt

(57) ABSTRACT

A semiconductor integrated circuit and method for compressing test stimuli to one test output signal during a test mode. The test output signal is driven from one input/output node of the semiconductor integrated circuit to a test station through a load board interface. Buffer circuitry on the semiconductor integrated circuit drive a high impedance to the input/output nodes of the integrated circuit during the test mode. The load board interface allows a single test station to receive test output signals from a plurality of semiconductor integrated circuits of the invention during the test mode, thereby allowing one test station to simultaneously test a plurality of circuits.

14 Claims, 5 Drawing Sheets

SEMICONDUCTOR INTEGRATED CIRCUIT HAVING COMPRESSION CIRCUITRY FOR COMPRESSING TEST DATA, AND THE TEST SYSTEM AND METHOD FOR UTILIZING THE SEMICONDUCTOR INTEGRATED CIRCUIT

CROSS-REFERENCE TO RELATED APPLICATIONS

This application is a continuation of application Ser. No. 09/175,518, filed Oct. 20, 1998, now U.S. Pat. No. 6,314,538, which is a continuation of application Ser. No. 08/881,946, filed Jun. 25, 1997, now U.S. Pat. No. 5,864,565, issued Jan. 26, 1999, which is a continuation of application Ser. No. 08/353,404, filed Dec. 9, 1994, now abandoned, which is a continuation-in-part of application Ser. No. 08/077,182, filed Jun. 15, 1993, now abandoned.

BACKGROUND OF THE INVENTION

1. Field of the Invention

The invention relates to semiconductor integrated circuits and, more particularly, to internal test circuitry of a semiconductor integrated circuit.

2. Background of the Invention

Semiconductor integrated circuits are typically tested in response to an applied input test signal. The semiconductor integrated circuits respond to the input test signal by providing a test output signal which is monitored to determine if the part has been manufactured correctly. With an increase in storage capacity and memory circuit functions, the testing of a semiconductor integrated circuit consumes more time and requires more testing hardware.

In FIG. 1, a memory component tester 5 of the related art is shown which has 4 test stations 7–10. Each test station 7–10 is used to test circuit functions of an individual semiconductor integrated circuit or, during testing known as, a device under test (DUT). Therefore when testing, say, four integrated circuits 12–15, as shown in FIG. 1, four test stations 7–10 are needed. Typically, each test station 7–10 has a number of pins 20 corresponding to the number of I/O (input/output) pins 25 on the DUT for coupling the test station to the DUT during testing. The DUT responds to applied test signals originating in the memory component tester 5 and generates test output signals in response to the applied test signals. The test stations monitor the test output signals to determine if a DUT has been manufactured correctly.

The ability to test in parallel is limited by the number of Pin Electronic Channels with comparator capability a memory component tester may have. How those limited resources are utilized by the product tested on test equipment is directly related to designing a test mode which makes best use of each Pin Electronics Channel. The present Micron Test Mode tri-states each unique I/O pin individually upon failure. This prevents the tying of multiple I/O pins together for greater parallel testing because a failing pin in a high impedance state is driven by a passing pin to a passing voltage level. The driving pin (Passing) would mask the tri-stated (failing) pin which would cause the failure to go undetected, and the failed part would be binned with those which passed testing.

In order to reduce the total manufacture time and decrease manufacturing costs there is a need to develop a faster testing method requiring less test equipment.

SUMMARY OF THE INVENTION

The invention is a semiconductor integrated circuit, method and test system for compressing test stimuli to one test output signal during a test mode. The test output signal is driven from one input/output node of the semiconductor integrated circuit to a test station through a load board interface of the invention. Buffer circuitry on the semiconductor integrated circuit drive a high impedance to the input/output nodes of the integrated circuit during the test mode. The load board interface allows a single test station to receive test output signals from a plurality of semiconductor integrated circuits of the invention during the test mode, thereby allowing one test station to simultaneously test a plurality of circuits.

DETAILED DESCRIPTION OF THE INVENTION

Figure 1:
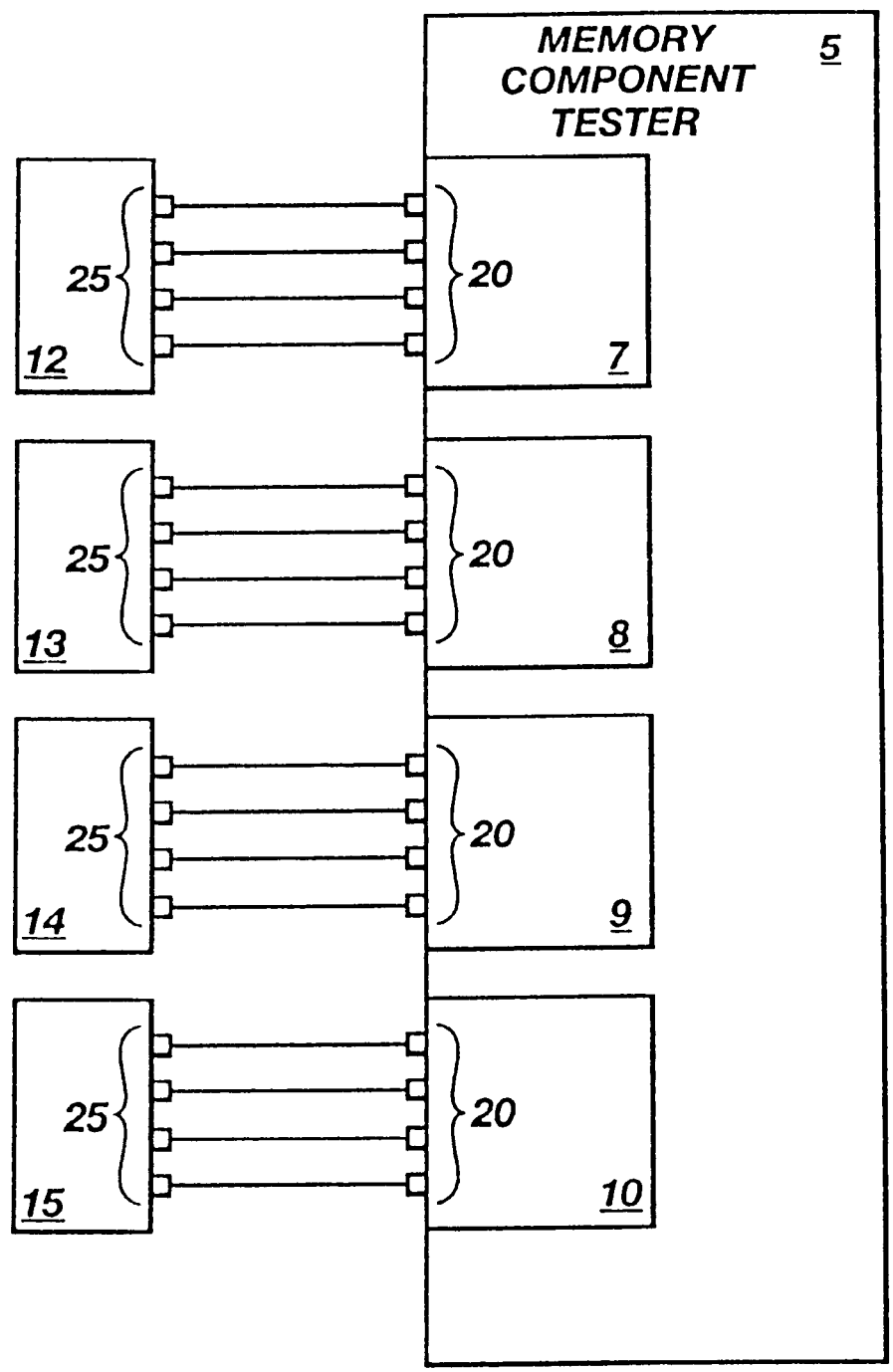
FIG. 1 is a block schematic of integrated circuits and a memory component tester of the related art.
Figure 2:
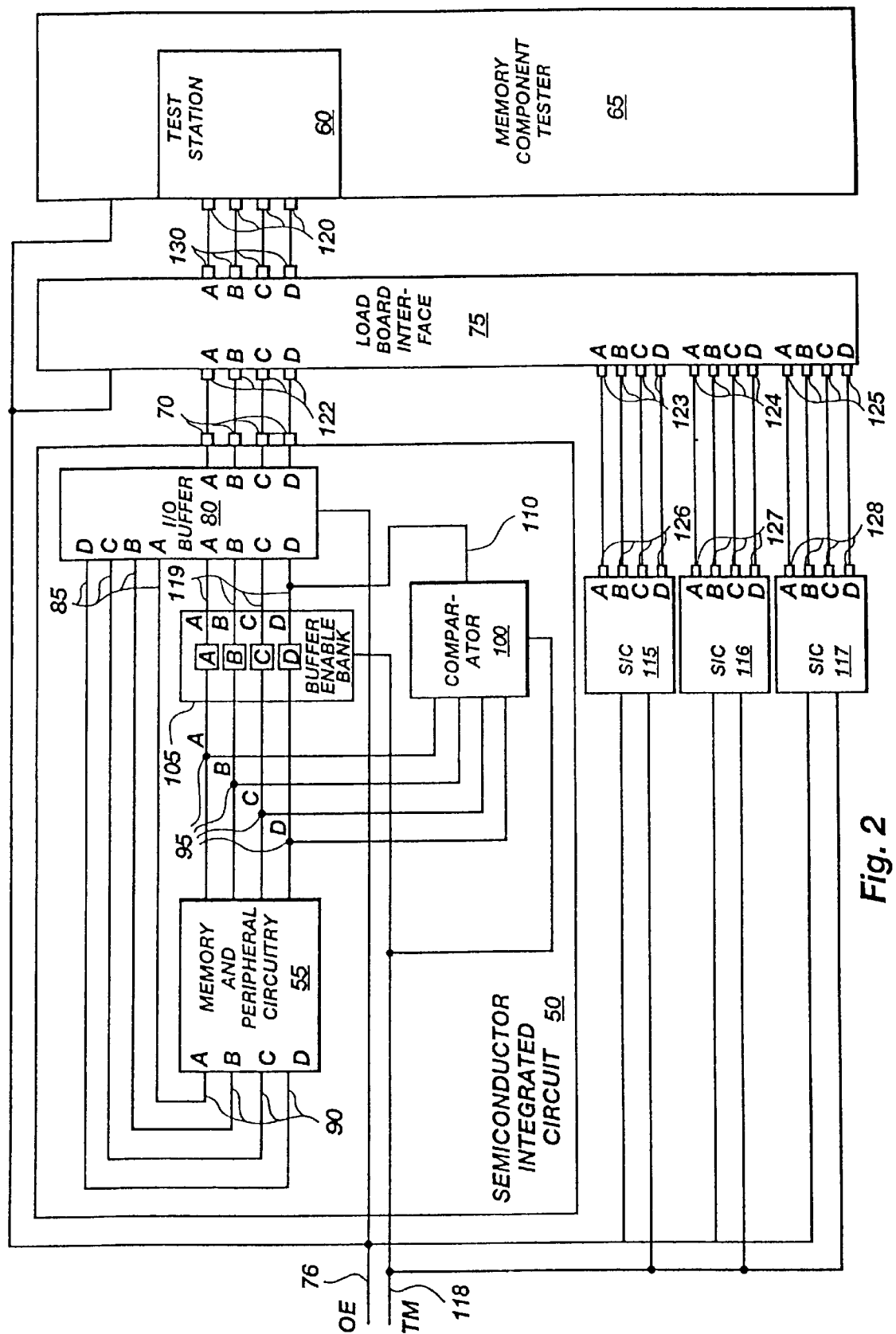
FIG. 2 is a block schematic of the semiconductor integrated circuit and a load board of the invention and a memory component tester.

FIG. 2 is a block schematic of a semiconductor integrated circuit 50 of one embodiment of the invention. The semiconductor integrated circuit 50 comprises memory and peripheral circuitry 55 for memory storage and retrieval in a user environment. During a test mode, typically performed subsequent to encapsulation of the semiconductor integrated circuit 50, input test data supplied by a test station 60 of a memory component tester 65 is applied on input/output (I/O) pins 70 having designations A–D. Designations A–D are used throughout this description to identify corresponding pins or nodes. A load board interface 75 of the invention couples the integrated circuit 50 to the test station 60. An output enable signal at node 76 controls an input/output buffer 80 to couple the input test data on input/output pins 70 to demux output nodes 85 during a test mode. The demux output nodes 85 are connected to input nodes 90 of the memory and peripheral circuitry 55. During normal operation the semiconductor integrated circuit 50 is disconnected from the load board interface 75 and input data is coupled from input/output pins 70 and input nodes 90 through the input/output buffer 80 in response to the output enable signal at node 76.

The memory and peripheral circuitry 55 respond to the input test data to provide output test data internally at nodes 95, which are input nodes to a test data comparator circuit 100 of the invention and a buffer enable bank 105 of the invention. The test data comparator circuit 100 compares the output test data at nodes 95 and provides a test output signal at comparator output node 110 when enabled by a test mode enable signal having a first logic state at test mode node 118. Therefore, the output test data at nodes 95 are compressed into one test output signal which indicates a pass or fail of the semiconductor integrated circuit 50. The comparator output node 110 is connected to one of the output nodes 119 of buffer enable bank 105, in this case D. The potential of the test output signal at comparator output node 110 has a first or second logic state, typically a high or a low, when all of the output test data at nodes 95 have a same logic state and a high impedance appears at comparator output node 110 when there is a difference in logic states of the output test data at nodes 95. When all of the output test data is the same, the memory and peripheral circuitry 55 is responding correctly to the input test data at nodes 90, and when at least two of the output test data have different logic states, the memory and peripheral circuitry 55 is not responding correctly to the input test data at nodes 90.

The buffer enable bank 105, with internal blocks A–D, drives a potential or presents a high impedance to nodes 119 as directed by the testmode signal at node 76. During a first test mode, a high impedance state is present on nodes 119, regardless of the value of the output test data at nodes 95, unless the high impedance is overridden by another signal such as the test output signal. Since the buffer enable bank 105 has driven node 119-D to a high impedance state during the first test mode, the test output signal on comparator output node 110 drives the potential of node 119-D to either a high or low logic state when the test data output at nodes 95 have a same logic state, and the high impedance state remains on node 119-D when there is a difference in the logic states of the output test data at nodes 95.

The load board interface 75 provides an electrical interface between four semiconductor integrated circuits 50 and 115–117 of the invention and four input/output (I/O) pins 120 of test station 60. Semiconductor integrated circuits 115–117 have the same internal circuitry as semiconductor integrated circuit 50. Therefore, components and component numbers described in semiconductor integrated circuit 50 are herein discussed as being in any of the semiconductor integrated circuits 115–117 of the invention. The load board interface 75 has four sets of pins 122–125 for connection to I/O pins 70 and I/O pins 126–128 of semiconductor integrated circuits 50 and 115–117, respectively. Each group of pins 122–125 are connected internally on the load board interface 75 to load board pins 130, which in turn are connected to pins 120. Thus, the test station 60 has the ability to apply input test signals to semiconductor integrated circuits 50 and 115–117 when connected to the circuits through the load board interface 75. Internal circuitry on load board interface 75 responds to the output enable signal to switch the internal connections of pins 123-D, 124-D and 125-D from pin 130-D to pins 130-C, 130-B, and 130-A, respectively, in order to supply a compressed test output signal from each of the semiconductor integrated circuits 50 and 115–117 to one test station, in this case test station 60, during the first test mode. Thus, the semiconductor integrated circuit and load board interface of the invention allow one test station to simultaneously perform the circuit tests on four semiconductor integrated circuits rather than one.

Thus, during testing in the first test mode of the semiconductor integrated circuit 50, the test station I/O pin 120-D receives a compressed test output signal from I/O pin 70-D through internal circuitry of the load board interface 75. Similarly, pins 120-A,B and C receive compressed test output signals from I/O pins 128-D, 127-D, and 126-D respectively. The circuitry of test station 60 determines from the potential or impedance on pin 120 whether the semiconductor integrated circuits 50 and 115–117 meet circuit test requirements. When the potential has a high or low logic state, the semiconductor integrated circuit meets the circuit test requirements of the first test mode. When a pin 120 is held at a high impedance, at least one of the circuit functions creating the output test data at nodes 95 of the pertinent semiconductor integrated circuit 50 or 115–117 does not meet circuit test requirements of the first test mode.

Although device input and output nodes have been referred to as input "pins" and output "pins", the gender of the "pins" is not necessarily male and may very well be female. Typically, the "pins" of the semiconductor integrated circuit of the invention and the load board interface of the invention and the test station are made in order to couple two devices with a male/female connection.

In the case where at least one of the semiconductor integrated circuits does not meet at least one circuit test requirement of the first test mode, a second test mode can be enabled to determine which circuit test is failing. During the second test mode, all four I/O pins 70, 126, 127 or 128 of the faulty device are connected to pins 122A–D. The test mode signal switches state to a second logic state to disable comparator circuit 100 and enable the buffer enable bank 105 for the second test mode, thereby allowing the test data outputs at nodes 95 to be driven to the I/O pins 70, 126, 127, or 128 through the buffer enable bank 105 and the input/output buffer 80. Now the test station 60 of the memory component tester can determine which of the four tests, represented by the test data now driven to pins 120 by the load board interface 75, do not meet circuit requirements.

During normal operation, the buffer enable bank 105 is disabled for the first test mode and enabled for normal operation by the test mode signal having the second logic state at node 118 in order that user data can be driven from nodes 95 through the buffer enable bank 105 and the input/output buffer 80 to pins 70, 126, 127, or 128.

The circuitry of the semiconductor integrated circuit of the invention, which compresses four test output signals to provide one test output signal in a first test mode, and the load board interface of the invention facilitate a reduction in hardware requirements during test and decrease test time. The hardware reduction is realized by the connection and testing of four semiconductor integrated circuits with one station rather than four test stations.

Although the semiconductor integrated circuits 50, 115–117 and load board interface 75 and test station 60 have been shown having groups of four I/O pins, the semiconductor integrated circuit and load board interface of the invention have applicability in cases where the number of I/O pins is greater or less than four. Thus, with an advent of more I/O pins, the number of semiconductor integrated circuits that can be simultaneously tested by one test station can be increased as long as the test station has a corresponding increase in I/Os.

Although the invention has been shown wherein a corresponding I/O pin D (70-D, 126-D, 127-D, and 128-D) on all of the semiconductor integrated circuits 50 and 115–117 is connected to an input pin 120 of test station 60 through load board interface 75, any one of the I/O pins 70 and 126–128 A–D may be selected for connection by altering the load board interface circuitry in order to multiplex the I/O pins 70 and 126–128 differently to test station 60 during the analysis of the compressed test output signals. Typically, this would occur in a case where the internal circuitry of the semiconductor integrated circuit of the invention is modified in order for the compressed output signal to appear at an I/O other than D.

Other variations include load board interface circuitry having two (or some other number) sets, rather than four sets of I/O pins 122–125, for connection to two semiconductor integrated circuits of the invention rather than four.

Figure 3:
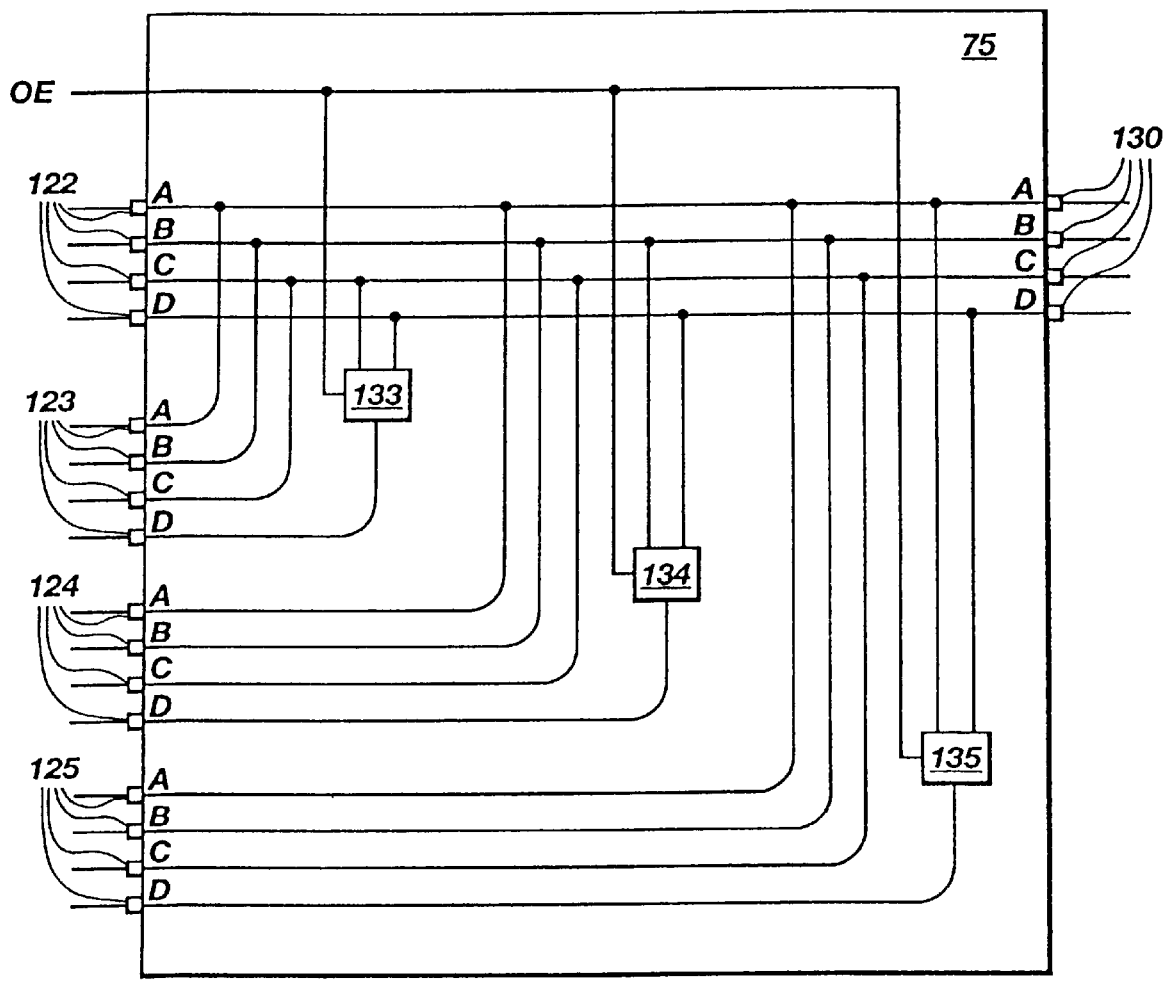
FIG. 3 is a simplified block schematic of the load board of FIG. 2.

FIG. 3 is a simplified block schematic of one load board interface 75. Pins 123-D, 124-D, and 125-D are connected to switching circuits 133, 134, and 135 respectively. When the load board interface is connected to the test station 60 of FIG. 2, the switching circuits 133, 134 and 135 connect pin 130-D to pins 123-D, 124-D, and 125-D, respectively, when the test station 60 is supplying test input data to the semiconductor integrated circuits 50 and 115–117 of FIG. 2; and the switching circuits 133, 134, and 135 connect pins 123-D, 124-D, and 125-D to pins 130-C, 130-B, and 130-A, respectively, when the test station 60 is receiving compressed test output signals from each of the semiconductor integrated circuits 50 and 115–117. The switching circuits switch between the two connections in response to the output enable signal at node 76.

Figure 4:
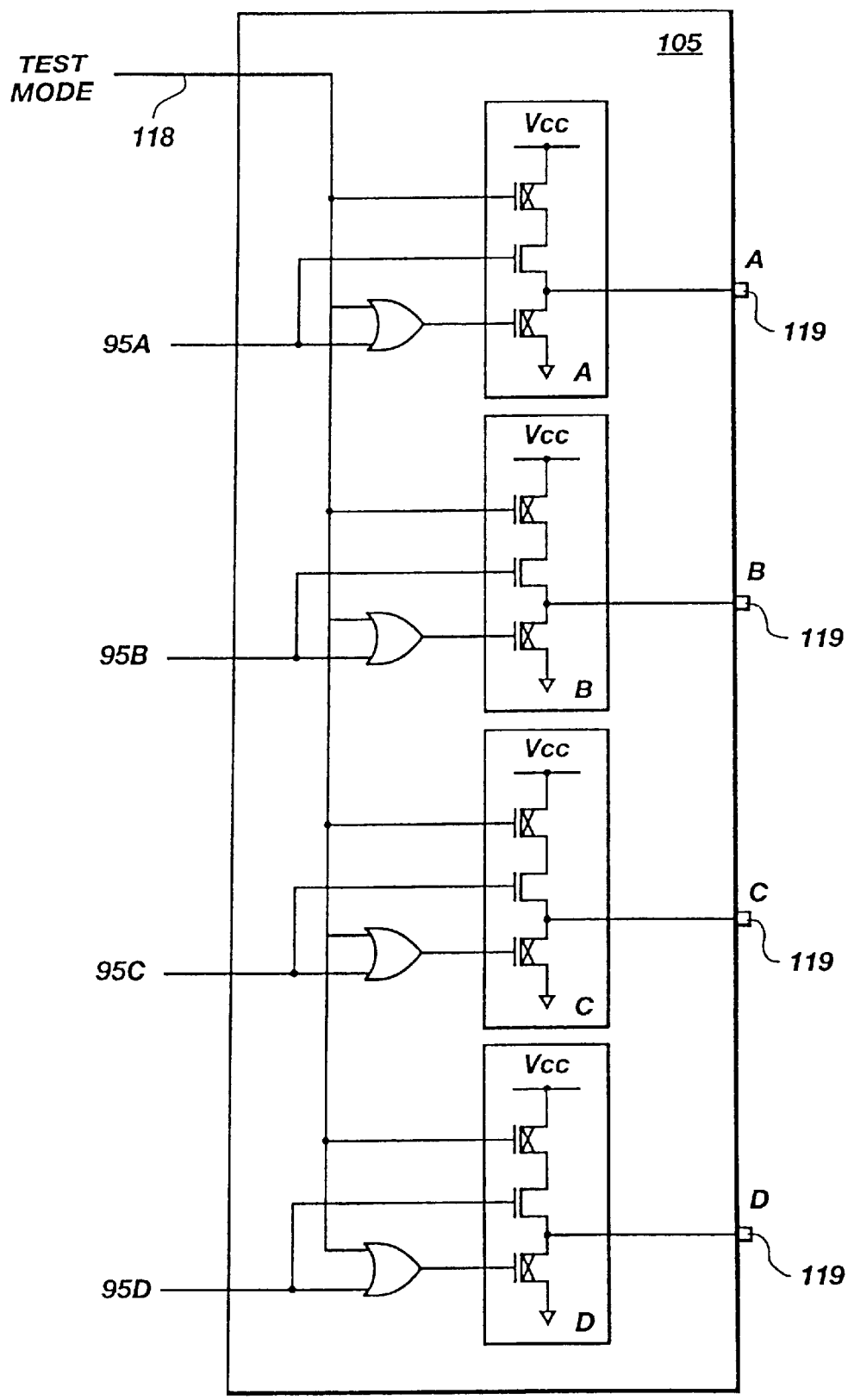
FIG. 4 is a schematic of the buffer bank shown in the block schematic of FIG. 2.

FIG. 4 is a schematic of the buffer enable bank 105. The circuitry in each block A–D is shown. It can be seen by studying the schematic that output nodes 119 have a high impedance when the test mode enable signal at node 118 is high, thereby disabling the buffer enable bank 105 during the first, test mode. When the test mode enable signal is low, the test mode buffer enable bank 105 is enabled for the second test mode and for normal circuit operation. During the second test mode and during normal operation, the test output data or user data on nodes 95 is driven through the buffer enable bank 105 to nodes 119 and then through input/output buffer 80 to input/output pins 70 (see FIG. 2). The low test mode signal also disables the comparator circuit 100 during the second test mode or during normal operation. It is possible within the spirit and scope of the invention to use other circuitries to perform the function of the buffer enable bank 105.

Figure 5:
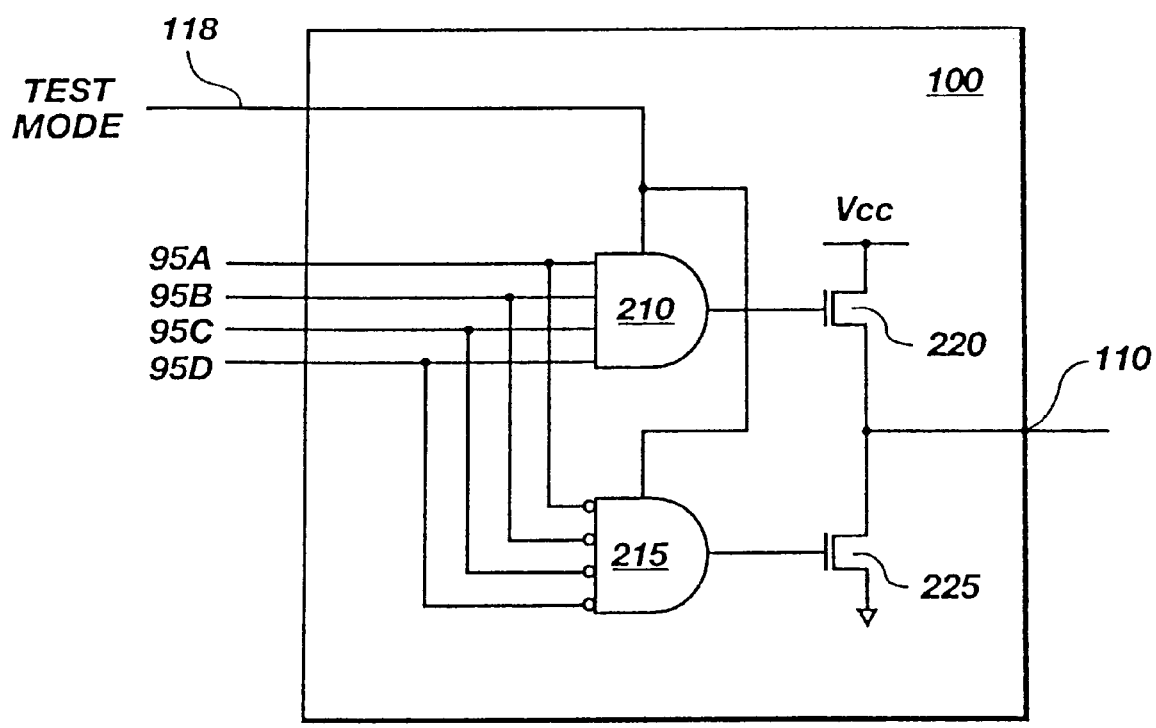
FIG. 5 is a schematic of the comparator circuit shown in the block schematic of FIG. 2.

FIG. 5 is the comparator circuit 100 of the semiconductor integrated circuit 50 of the invention. The test mode enable signal having the first logic state enables AND gate 210 and negative AND gate 215. When the output test data on all of the nodes 95 have a high logic state, the output of AND gate 210 is high which actuates NMOS transistor 220 driving comparator output node 110 to a potential having a high logic state indicating that the semiconductor integrated circuit passes the circuit tests. When the output test data on all of the nodes 95 have a low logic state, the output of negative AND gate 215 is high which actuates NMOS transistor 225, driving the potential of comparator output node 110 to a potential having a low logic state indicating that the semiconductor circuit passes the circuit test. When the potentials on nodes 95 have different logic states, the outputs of AND gate 210 and negative AND gate 215 are low and transistors 220 and 225 are deactuated, In this case, comparator output node 110 has a high impedance indicating that at least one of the data signals on nodes 95 is not correct. Thus, the comparator circuit 100 compresses the four output test data on nodes 95 into one test output signal at node 110. It is possible for other circuit implementations to replace the implementation shown in FIG. 5 without departing from the spirit and scope of the invention.

What is claimed is:

1. A load board interface, comprising:
    a plurality of sets of interface nodes, each interface node of each of said plurality of sets of interface nodes configured to connect to corresponding input/output nodes of a semiconductor integrated circuit;
    one set of tester nodes, each tester node of said one set of tester nodes configured to connect to one test station of a memory component tester; and
    a switching structure for electrically connecting each tester node of said one set of tester nodes to a corresponding one of said interface nodes of each of said sets of interface nodes, and for electrically connecting at least one interface node of each of said sets of interface nodes to a corresponding one of said tester nodes.

2. A load board interface comprising:
    at least one interface circuit comprising:
        a set of test nodes configured for electrical coupling with a test station;
        a plurality of interface node sets, each set of interface nodes of the plurality being configured for electrical coupling with an individual semiconductor integrated circuit, each set of interface nodes including a plurality of discrete interface nodes wherein each discrete interface node of a set is electrically coupled with a corresponding test node of the set of test nodes, one discrete interface node of each set of the plurality being designated as a compressed output node, and wherein at least one of the compressed output nodes is selectively coupled with the corresponding test node via a switch, the switch being configured to disconnect the at least one compressed output node from the corresponding test node and connect the at least one compressed output node to another test node.

3. The load board interface of claim 2, wherein the at least one interface circuit comprises multiple interface circuits.

4. The load board interface of claim 2, wherein the at least one compressed output node coupled to the corresponding test node via a switch includes each compressed output node except one, and wherein each compressed output node except one is coupled to the corresponding test node via a mutually independent switch.

5. The load board interface of claim 4, wherein each mutually independent switch is configured to disconnect the compressed output test node associated therewith from the corresponding test node and connect the compressed output test node associated therewith to another test node such that each output test node is connected to a different test node of the set of test nodes.

6. A test system comprising:
    a plurality of semiconductor integrated circuits, each of said plurality of semiconductor integrated circuits comprising internal test circuitry for producing at least one compressed test output signal during a first test mode and for producing a plurality of uncompressed test output signals during a second test mode;
    at least one test station; and
    at least one load board interface having at least one interface circuit comprising:
        a set of test nodes electrically coupled with the at least one test station;
        a plurality of interface node sets, each set of interface nodes being configured for electrical coupling with an individual semiconductor integrated circuit of the plurality, each set of interface nodes having a plurality of discrete interface nodes wherein each discrete interface node of a set is configured to be electrically coupled with a corresponding test node of the set of test nodes, one discrete interface node of each set being designated as a compressed output node, and wherein at least one of the compressed output nodes is selectively coupled with the corresponding test node via a switch, the switch being configured to disconnect the at least one compressed output node from the corresponding test node and connect the at least one compressed output node to another test node.

7. A method of testing a plurality of semiconductor integrated circuits, said method comprising:

providing an electrical connection from a plurality of input/output nodes on each of said plurality of semiconductor integrated circuits to a test station;

initiating a first test mode;

receiving a compressed test output signal from each of said plurality of semiconductor integrated circuits at said test station during said first test mode;

determining whether at least one of said plurality of semiconductor integrated circuits is a faulty device during said first test mode; and if faulty, initiating a second test mode.

8. The method according to claim 7, wherein said initiating a first test mode comprises:

providing input test data to said plurality of input/output nodes on each of said plurality of semiconductor integrated circuits from said test station; and internally performing a plurality of circuit tests in each of said plurality of semiconductor integrated circuits using said input test data.

9. The method according to claim 8, wherein said internally performing a plurality of circuit tests comprises:

internally generating a plurality of uncompressed test signals in each of said plurality of semiconductor integrated circuits in response to said input test data;

comparing said plurality of uncompressed test signals in each of said semiconductor integrated circuits to determine whether any of said plurality of circuit tests failed; and internally generating said compressed test output signal in each of said plurality of semiconductor integrated circuits indicative of whether any of said plurality of circuit tests failed.

10. The method according to claim 7, wherein said receiving a compressed test output signal from each of said plurality of semiconductor integrated circuits at said test station comprises:

driving a high impedance to said plurality of input/output nodes on each of said plurality of semiconductor integrated circuits;

driving said compressed test output signal from each of said plurality of semiconductor integrated circuits to one of said plurality of input/output nodes on each of said plurality of semiconductor integrated circuits; and switching each of said compressed test output signals from said plurality of semiconductor integrated circuits to a distinct input/output pin on said test station.

11. The method according to claim 7, wherein said determining whether at least one of said plurality of semiconductor integrated circuits is a faulty device comprises detecting a high impedance on an input/output pin on said test station corresponding to said compressed test output signal received from said at least one of said plurality of semiconductor integrated circuits.

12. The method according to claim 7, wherein said initiating a second test mode comprises individually testing each said determined faulty device.

13. The method according to claim 12, wherein said individually testing each said determined faulty device comprises:

connecting one said determined faulty device to said test station;

providing input test data to said plurality of input/output nodes on said one determined faulty device from said test station;

internally performing a plurality of circuit tests in said one determined faulty device using said input test data; and using said test station to determine which of said circuit test is failed.

14. The method according to claim 13, wherein said internally performing a plurality of circuit tests comprises:

internally generating a plurality of uncompressed test signals in said one determined faulty device in response to said input test data; and outputting each of said plurality of uncompressed test signals to said test station.

\* \* \* \* \*

UNITED STATES PATENT AND TRADEMARK OFFICE
CERTIFICATE OF CORRECTION

PATENT NO.        : 6,546,512 B1
APPLICATION NO.   : 09/940010
DATED             : April 8, 2003
INVENTOR(S)       : Roland Ochoa, Gregory L. Cowan and Kim M. Pierce It is certified that error appears in the above-identified patent and that said Letters Patent is hereby corrected as shown below:

| | | |
|---|---|---|
| COLUMN 1, | LINE 11, | after "538," insert --issued Nov. 6, 2001,-- |
| COLUMN 1, | LINE 44, | after "stations" insert --7-10-- |
| COLUMN 1, | LINE 47, | change "(Passing)" to --(passing)-- |
| COLUMN 4, | LINE 20, | after "component tester" insert --65-- |

Signed and Sealed this

Twentieth Day of March, 2007

JON W. DUDAS
*Director of the United States Patent and Trademark Office*